United States Patent [19]

Kaganowicz et al.

[11] Patent Number: 4,705,760
[45] Date of Patent: Nov. 10, 1987

[54] PREPARATION OF A SURFACE FOR DEPOSITION OF A PASSINATING LAYER

[75] Inventors: Grzegorz Kaganowicz, Belle Mead; Ronald E. Enstrom, Skillman, both of N.J.; John W. Robinson, Levittown, Pa.

[73] Assignee: RCA Corporation, Princeton, N.J.

[21] Appl. No.: 871,316

[22] Filed: Jun. 6, 1986

Related U.S. Application Data

[63] Continuation-in-part of Ser. No. 819,286, Jan. 16, 1986, abandoned.

[51] Int. Cl.$^4$ .................. H01L 21/306; H01L 21/318
[52] U.S. Cl. ........................... 437/234; 148/DIG. 17; 148/DIG. 119; 156/643; 156/651; 427/38
[58] Field of Search .............. 148/DIG. 17, DIG. 51, 148/DIG. 114, DIG.119, 174; 156/643, 648, 651, 662; 427/38, 39, 93, 94; 29/576 T

[56] References Cited

U.S. PATENT DOCUMENTS

| | | | |
|---|---|---|---|
| 3,200,019 | 1/1962 | Scott, Jr. et al. | 148/188 |
| 3,765,935 | 10/1973 | Rand et al. | 117/201 |
| 3,886,000 | 5/1975 | Bratter et al. | 148/175 |
| 4,084,986 | 4/1978 | Aoki et al. | 148/1.5 |
| 4,210,689 | 7/1980 | Komatsu | 427/88 |
| 4,277,320 | 7/1981 | Beguwala et al. | 204/164 |
| 4,282,270 | 8/1981 | Nozaki et al. | 427/93 |
| 4,363,868 | 12/1982 | Takasaki et al. | 430/314 |
| 4,391,843 | 7/1983 | Kaganowicz et al. | 427/41 |
| 4,396,443 | 8/1983 | Lewerenz et al. | 148/171 |
| 4,455,351 | 6/1984 | Camlibel et al. | 428/450 |
| 4,512,284 | 4/1985 | Robinson et al. | 118/723 |
| 4,543,707 | 10/1985 | Ito et al. | 29/578 |

FOREIGN PATENT DOCUMENTS 51-99976  9/1976  Japan .

OTHER PUBLICATIONS

"Plasma Passivation Scheme for III-V Compound Semiconductor Surfaces" by Theeten et al.
Poponiak et al., IBM Technical Disc. Bulletin, vol. 19, No. 3, Aug., 1976.
"Vapor-phase Epitaxy of GaInAsP" by G. H. Olsen.
Sus et al., Japanese Journal of Appl. Physics, vol. 19, pp. L675–L678, 1980.

Primary Examiner—Olik Chaudhuri
Attorney, Agent, or Firm—Harley R. Ball; Marvin Snyder

[57] ABSTRACT

A method of making a semiconductor device including forming regions of first and second conductivity types with a semiconductor junction therebetween which extends to a surface of the device, and depositing a passivating layer over the surface to overlie the junction, further comprises a pretreatment of the surface to enhance the electrical properties of the device and the effectiveness of the passivating layer. The pretreatment, carried out prior to deposition of the passivating layer, includes treating the surface with an aqueous ammonium fluoride-hydrogen fluoride solution and thereafter subjecting the surface to a plasma in an oxygen-free, nitrogen-containing ambient.

10 Claims, No Drawings

PREPARATION OF A SURFACE FOR DEPOSITION OF A PASSINATING LAYER

RELATED APPLICATIONS

This application is a continuation-in-part of U.S. patent application Ser. No. 819,286, filed Jan. 16, 1986, now abandoned.

This invention relates to the fabrication of a semiconductor device having a passivating layer on a major surface thereof and, more particularly, concerns a pretreatment of the surface which enhances the passivating process.

BACKGROUND OF THE INVENTION

The semiconductor device passivated in accordance with this invention includes a semiconductor junction, e.g. a p-n or p-i-n junction, a region of a first conductivity type and a region of a second conductivity type formed therein or thereover. The semiconductor junction formed between these regions typically extends to one or more surfaces of the device. The junction periphery, i.e. the area where the semiconductor junction intersects the surface, in known devices of this type is typically characterized by edge breakdown and multiplication of surface currents which substantially increase the dark current, i.e. the reverse bias leakage current, which flows with no light incident on the device. This has the adverse effect of providing a less sensitive photodetector.

The incidence of edge breakdown and surface currents has been reduced by fabricating photodetectors such that the second region is a well-like area within the first region. This can be done, for example, by depositing a mask over the top surface of the first region and diffusing a dopant of the opposite conductivity type through an opening therein. This provides a junction which extends to the top surface of the first region under the mask. Preferably, the diffusion mask should also serve as a protective passivating layer since it covers the device surface at the semiconductor junction periphery. A copending application entitled, "SILICON OXYNITRIDE PASSIVATED SEMICONDUCTOR BODY AND METHOD OF MAKING SAME", U.S. Pat. Ser. No. 819,296, filed Jan. 16, 1986, discloses a class of silicon oxynitride compounds suitable for this purpose.

A problem of many semiconductor devices is that exposure of the surface to the atmosphere prior to deposition of the passivating layer can adversely affect device performance characteristics. For example, photodetectors, even when passivated with the above-described silicon oxynitride material, may have high dark current due to previous exposure of the device surface to the ambient.

Therefore, a method of treating and modifying the surface of a semiconductor device, which method is compatible with passivating layer deposition methods has been sought.

SUMMARY OF THE INVENTION

A method of making a semiconductor device including forming regions of first and second conductivity types with a semiconductor junction therebetween which extends to a surface of the device, and depositing a passivating layer on the surface overlying the junction, further comprises a pretreatment of the surface to enhance the electrical properties of the device and the effectiveness of the passivating layer. The pretreatment, carried out prior to deposition of the passivating layer, includes treating the surface with an aqueous ammonium fluoride-hydrogen fluoride solution and thereafter subjecting the surface to a plasma in an oxygen-free, nitrogen-containing ambient.

DETAILED DESCRIPTION OF THE PREFERRED EMBODIMENTS

A class of silicon oxynitride materials having refractive indices between about 1.55 and 1.75 as measured at a wavelength of 632.8 nanometers (nm) are suitable as passivating layers for semiconductor devices, particularly for indium phosphide-containing devices, e.g. indium phosphide-capped photodetectors having an InGaAs optical absorption region. Silicon oxynitrides having a refractive index beyond 1.75 contain very little oxygen, i.e. they approach silicon nitride. Such films are characterized by a high degree of stress which causes peeling of the passivating layer and, ultimately, failure of the device.

In the present invention, the fabrication of a passivated semiconductor device is improved by treating the surface to be passivated with an aqueous ammonium fluoride-hydrogen fluoride solution and thereafter subjecting the surface to a plasma in an oxygen-free, nitrogen-containing ambient directly prior to plasma deposition of the passivating layer. This method has increased the yield of satisfactory devices having silicon oxynitride passivation coatings within the above-defined range. Unexpectedly, the surface preparation method of the present invention has also lowered the average dark current of such devices.

A basic method for making a semiconductor device involves forming a first region of a first conductivity type and then forming a second region of a second conductivity type therein or thereover with a semiconductor, e.g. a p-n, junction therebetween which typically extends to one or more surfaces of the device. A passivating layer is deposited over the surface at the junction to reduce edge breakdown and multiplication of surface currents. The passivating layer may be deposited prior to formation of the second region if the passivating layer is also to function as a diffusion mask. In this method, a suitable dopant is diffused through an opening created in the mask/passivating layer to form the second conductivity type region.

The semiconductor regions can be formed by known vapor-phase, liquid-phase or molecular beam epitaxial techniques. One such technique is described by G. H. Olsen in "Vapour-phase Epitaxy of GaInAsP", a chapter from *GaInAsP ALLOY SEMICONDUCTORS*, edited by T. P. Pearsall. The passivating layer can be formed by known vapor deposition techniques. For example, our copending application discloses the formation of silicon oxynitride passivating layers by plasma enhanced chemical vapor deposition.

In accordance with the present invention, prior to deposition of the passivating layer, the surface of the semiconductor device is treated with an aqueous ammonium fluoride-hydrogen fluoride solution. Commonly known as buffered HF or ammonium bifluoride, this solution typically comprises from about 4:1 to about 6:1 ratio by volume of an aqueous solution containing about 40 percent by weight of ammonium fluoride and an aqueous solution containing about 49 percent by weight of hydrogen fluoride. Commercial standard buffered HF generally contains these solutions in a ratio by volume of about 5:1. The treatment is suitably carried out at room temperature for between about 15 and 100 seconds, which has been found is suitable for indium phosphide-based photodetectors, with about 30 seconds of treatment being preferred.

The buffered HF treatment is followed (after appropriate rinsing and drying) by subjecting the surface to a plasma in an oxygen-free, nitrogen-containing ambient, e.g. nitrogen ($N_2$) or ammonia ($NH_3$). Materials containing oxygen have been found to be detrimental to indium-containing semiconductors. This part of the process can be carried out in a conventional plasma, or glow discharge generating apparatus such as that disclosed by Robinson et al. in U.S. Pat. No. 4,512,284. For indium phosphide-containing devices, e.g. photodetectors, the device is placed into the system which is evacuated to about $10^{-6}$ Torr. The oxygen-free, nitrogen-containing material, such as $N_2$ or $NH_3$, is suitably added to a pressure of between about 30 and 100 millitorr, with about 50 millitorr being preferred. In a system with an electrode having an area of about 300 square centimeters, the plasma requires RF power of between about 50 watts and 1 kilowatt at 13.56 MHz. This provides a power density of between about 0.1 and 3.5 watts per square centimeter of electrode area ($W/cm^2$). About 400 watts of power providing a power density of about 1.3 $W/cm^2$ is preferred. The plasma may be maintained for any suitable time depending upon the particular application. Between about 10 and 300 seconds has been found appropriate for indium phosphide photodetectors, with about 60 seconds being preferred. The temperature during the plasma step is typically between about 25° C. and 200° C., preferably about 25° C. Following this treatment, an appropriate passivating layer can be deposited over the surface. Preferably, the deposition of the passivating layer is carried out by a plasma process which immediately follows the above-described plasma step in the same apparatus without exposure of the device to the ambient.

The buffered HF step and the plasma step have been assessed individually and it has been found that the $N_2$ or $NH_3$ plasma alone provides better adhesion of the passivating layer to the semiconductor material. This tends to reduce some of the stress problems associated with silicon oxynitride layers compositionally close to pure silicon nitride and, surprisingly, provides sharper breakdown characteristics for the device. The buffered HF treatment alone unexpectedly provides a lower range of dark currents as compared to the plasma step alone.

The present method is particularly advantageous in the fabrication of an indium phosphide planar photodetector wherein a silicon oxynitride coating having a range of refractive indices between 1.55 and 1.75 is used both as a diffusion mask for junction formation and as the passivating layer. However, the present method would be beneficial to the fabrication of any type of passivated semiconductor device.

The following Example further illustrates this invention, it being understood that the invention is in no way intended to be limited to the details described therein. In the Example, all parts and percentages are on a weight basis and all temperatures are in degrees Celsius, unless otherwise stated.

EXAMPLE

Six lots of 100 identical InGaAs/InP semiconductor bodies were prepared by vapor phase epitaxial techniques known in the art. The individual lots were then processed as follows:

LOT #1: The semiconductor bodies were treated for 30 seconds in a standard buffered HF solution at room temperature. The solution was comprised of a 40 percent aqueous solution of ammonium fluoride and a 49 percent aqueous solution of hydrogen fluoride in a ratio by volume of about 5:1. After rinsing and drying and within about 3 minutes, the bodies were subjected to a plasma of $NH_3$ at 400 watts (providing a power density of about 1.3 $W/cm^2$) for about 60 seconds at 25°.

LOT #2: This lot was treated only in the buffered HF solution as described in Lot #1.

LOT #3: This lot was subjected only to the plasma step as described in Lot #1.

LOT #4: This lot was given no pretreatment.

LOT #5 This lot was subjected to a hydrogen plasma at 400 watts(providing a power density of about 1.3 $watts/cm^2$) for 60 seconds at 25°.

LOT #6 This lot was subjected to the buffered HF treatment as described in Lot #1 followed by the hydrogen plasma as described in Lot #5.

A layer of silicon oxynitride having a refractive index of about 1.6 was then deposited over all six lots as described in copending application Ser. No. 819,296. In the case of Lot #1 and Lot #3, this occurred in the same system as the plasma step immediately following that step. Openings were etched by known methods through the silicon oxynitride layer and zinc was diffused into the bodies to form photodetector devices. The Table below illustrates the effect each procedure had on the range of dark currents for devices from each lot.

It is clearly evident from the results of Lot #5 and Lot #6 that treatment with hydrogen plasma, which is described in the literature as a pretreatment for certain semiconductor surfaces, has a significant adverse effect on indium phosphide.

TABLE

| Lot # | Pretreatment | Range of Dark Current (nanoamps) |
|---|---|---|
| 1 | Buffered HF & $NH_3$ plasma | 1–4 |
| 2 | Buffered HF | 2–5 |
| 3 | $NH_3$ plasma | 4–22 |
| 4 | None | 8–20 |
| 5 | $H_2$ plasma | 1100–4000 |
| 6 | Buffered HF & $H_2$ plasma | >5000 |

We claim:
1. In a method of making a semiconductor device comprisisng:
   forming a first region of a first conductivity type, said region comprising indium phosphide;
   forming a second region of a second conductivity type adjacent said first region with a semiconductor junction therebetween, which junction extends to a surface of said device; and
   depositing a passivating layer over said surface to overlie said junction, said passivating layer being deposited prior to or subsequent to formation of the second region;
   wherein the improvement comprises treating said surface with an aqueous ammonium fluoride- hydrogen fluoride solution, thereafter subjecting said surface to a plasma in an oxygen-free, nitrogen-containing ambient at a temperature between about 25° C. and 200° C. and immediately depositing the passivating layer without exposing said surface to oxygen.

2. A method in accordance with claim 1, wherein the plasma step is carried out at about 25° C.

3. A method in accordance with claim 1, wherein the passivating layer is deposited on a surface of the first region before formation of the second region and wherein the second region is formed within the first region by diffusion of said second conductivity type, said method additionally including the step of forming an opening in the passivating layer whereby the remaining portion of the passivating layer functions as a mask for said diffusion.

4. A method in accordance with claim 1, wherein the passivating layer comprises silicon oxynitride having a refractive index between about 1.55 and 1.75.

5. A method in accordance with claim 1, wherein said solution is a buffered hydrogen fluoride solution comprising an aqueous solution of about 40 percent by weight of ammonium fluoride and an aqueous solution of about 49 percent by weight of hydrogen fluoride, said solution being combined in a ratio of from 4:1 to about 6:1 by volume.

6. A method in accordance with claim 1, wherein the nitrogen-containing ambient is selected from the group consisting of nitrogen and ammonia.

7. A method in accordance with claim 1, wherein the plasma is carried out at a pressure of between about 30 and 100 millitorr.

8. A method in accordance with claim 7, wherein the plasma is carried out at a pressure of about 50 millitorr.

9. A method in accordance with claim 1, wherein the plasma step is carried out in an apparatus having an electrode at an RF power sufficient ot provide a power density between about 0.1 and 3.5 watts per square centimeter of surface of said electrode.

10. A method in accordance with claim 9, wherein the plasma step is carried out at an RF power sufficient to provide a power density of about 1.3 watts per square centimeter of electrode surface.

* * * * *

UNITED STATES PATENT AND TRADEMARK OFFICE
CERTIFICATE OF CORRECTION

PATENT NO. : 4,705,760

DATED : Nov. 10, 1987

INVENTOR(S) : G. Kaganowicz et al.

It is certified that error appears in the above-identified patent and that said Letters Patent is hereby corrected as shown below:

IN THE TITLE:

"PASSINATING" should be --PASSIVATING--.

IN THE CLAIMS:

Claim 1, column 4, line 56, "comprisisng" should be --comprising--.

column 5, line 4, after "C" (both instances) delete "." (both instances).

Claim 9, column 6, line 16, "prov:de" should be --provide--.

Claim 4, column 5, line 19, "siicon" should be --silicon--.

Signed and Sealed this

Ninth Day of August, 1988

Attest:

DONALD J. QUIGG

Attesting Officer

Commissioner of Patents and Trademarks